(12) United States Patent
Seo et al.

(10) Patent No.: US 12,741,349 B2
(45) Date of Patent: Sep. 22, 2026

(54) ELECTROSTATIC CHUCK

(71) Applicant: SAMSUNG ELECTRONICS CO., LTD., Suwon-si (KR)

(72) Inventors: Inseok Seo, Suwon-si (KR); Minsung Kim, Suwon-si (KR); Dasom Lee, Suwon-si (KR); Heewon Min, Suwon-si (KR); Dongyun Yeo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 401 days.

(21) Appl. No.: 18/233,374

(22) Filed: Aug. 14, 2023

(65) Prior Publication Data

US 2024/0100639 A1 Mar. 28, 2024

(30) Foreign Application Priority Data

Sep. 23, 2022 (KR) ........................ 10-2022-0120909

(51) Int. Cl.
*B23Q 3/15* (2006.01)
*H02N 13/00* (2006.01)
*H10P 72/72* (2026.01)

(52) U.S. Cl.
CPC .............. *B23Q 3/15* (2013.01); *H02N 13/00* (2013.01); *H10P 72/722* (2026.01)

(58) Field of Classification Search
CPC . B23Q 3/15; H01L 21/6833; H01L 21/67109; H01L 21/6831; H01L 21/68757; H02N 13/00; H10P 72/722; H10P 72/72; H10P 72/0434; H10P 72/7616
See application file for complete search history.

(56) References Cited

U.S. PATENT DOCUMENTS 6,338,906 B1 * 1/2002 Ritland et al. .... H01L 23/49827 428/539.5
6,558,508 B1 5/2003 Kawakami
7,126,093 B2 * 10/2006 Goto et al. ........ H01L 21/67103 219/444.1

(Continued)

FOREIGN PATENT DOCUMENTS

JP H11-265931 A 9/1999
JP 4399396 B2 1/2010

(Continued)

OTHER PUBLICATIONS

Office Action in Korean Appln. No. 10-2022-0120909, mailed on Jul. 30, 2025, 12 pages (with English translation).

(Continued)

*Primary Examiner* — Jerry-Daryl Fletcher
*Assistant Examiner* — Dario Antonio Deleon
(74) *Attorney, Agent, or Firm* — Fish & Richardson P.C.

(57) ABSTRACT

An electrostatic chuck includes a cooling plate having a cooling flow path, an insulating plate disposed on the cooling plate, an upper plate disposed on the insulating plate and fixed to the cooling plate, and a fastening member coupling the cooling plate to the upper plate. The fastening member passes through the cooling plate and is coupled to a fastening portion provided on a lower surface of the upper plate. Movement of the fastening member is constrained only in a first direction intersecting an upper surface of the upper plate.

18 Claims, 4 Drawing Sheets

(56) References Cited

U.S. PATENT DOCUMENTS

| | | | | |
|---|---|---|---|---|
| 10,249,526 | B2 | 4/2019 | Parkhe | |
| 2006/0193101 | A1* | 8/2006 | Sogabe et al. | H01L 21/6831 361/234 |
| 2016/0111315 | A1* | 4/2016 | Parkhe | H01L 21/68785 361/234 |
| 2016/0343600 | A1 | 11/2016 | Parkhe | |
| 2019/0189491 | A1* | 6/2019 | Akatsuka | H01L 21/67103 |
| 2020/0185248 | A1* | 6/2020 | Sarode et al. | H01L 21/6833 |
| 2021/0287923 | A1 | 9/2021 | Parkhe | |

FOREIGN PATENT DOCUMENTS

| | | | |
|---|---|---|---|
| JP | 2016-143795 | A | 8/2016 |
| KR | 10-2006-0094912 | A | 8/2006 |
| KR | 10-2009-0025022 | A | 3/2009 |
| KR | 10-2017-0001990 | A | 1/2017 |
| KR | 10-2019-0032545 | A | 3/2019 |
| KR | 10-2019-0091763 | A | 8/2019 |
| KR | 10-2020-0008959 | A | 1/2020 |

OTHER PUBLICATIONS

Notice of Allowance in Korean Appln. No. 10-2022-0120909, mailed on May 30, 2026, 6 pages (with machine translation).

* cited by examiner

ELECTROSTATIC CHUCK

CROSS-REFERENCE TO RELATED APPLICATION(S)

A claim of priority is made to Korean Patent Application No. 10-2022-0120909 filed on Sep. 23, 2022, in the Korean Intellectual Property Office, the disclosure of which is incorporated herein by reference in its entirety.

BACKGROUND

The present disclosure relates to electrostatic chucks.

Semiconductor devices and display devices are manufactured by stacking and patterning a plurality of thin film layers (including dielectric and metal layers) on a substrate through various semiconductor processes, such as chemical vapor deposition (CVD) processes, physical vapor deposition (PVD) processes, ion implantation processes, plasma treatment processes, etching processes, and so on. Examples of the substrate include glass substrates, flexible substrates, semiconductor wafers, and so on. Processing chambers utilized to perform these processes may include an electrostatic chuck which supports the substrate during processing. The electrostatic chuck is configured to fix the substrate in place within the chamber using electrostatic force.

One technique utilized to reduce the size of patterns formed on the substrate is to enhance etch selectivity properties by increasing the volatility of film etching by-products. This technique utilizes relatively high processing temperatures which can cause problems in the operability of conventional electrostatic chucks.

SUMMARY

An aspect of the present disclosure is to provide an electrostatic chuck that may be used without damage in a high-temperature environment.

According to an aspect of the present disclosure, an electrostatic chuck includes a cooling plate having a cooling flow path; an insulating plate disposed on the cooling plate; an upper plate disposed on the insulating plate and fixed to the cooling plate; and a fastening member coupling the cooling plate to the upper plate. The fastening member passes through the cooling plate and is coupled to a fastening portion provided on a lower surface of the upper plate, and movement of the fastening member is constrained only in a first direction intersecting an upper surface of the upper plate.

BRIEF DESCRIPTION OF DRAWINGS

The above and other aspects, features, and advantages of the present disclosure will be more clearly understood from the detailed description that follows, taken in conjunction with the accompanying drawings, in which.

DETAILED DESCRIPTION

Hereinafter, example embodiments of the present disclosure will be described with reference to the accompanying drawings.

Figure 1:
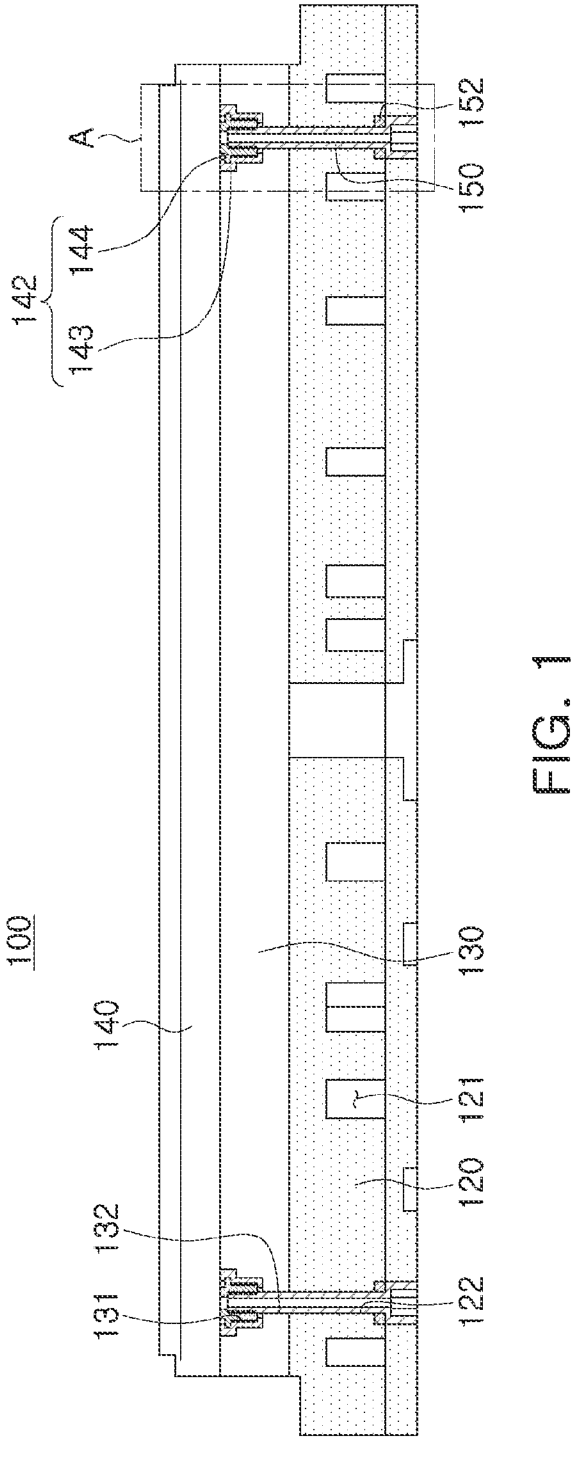
FIG. 1 is a diagram illustrating the configuration of an electrostatic chuck according to an example embodiment.
Figure 2:
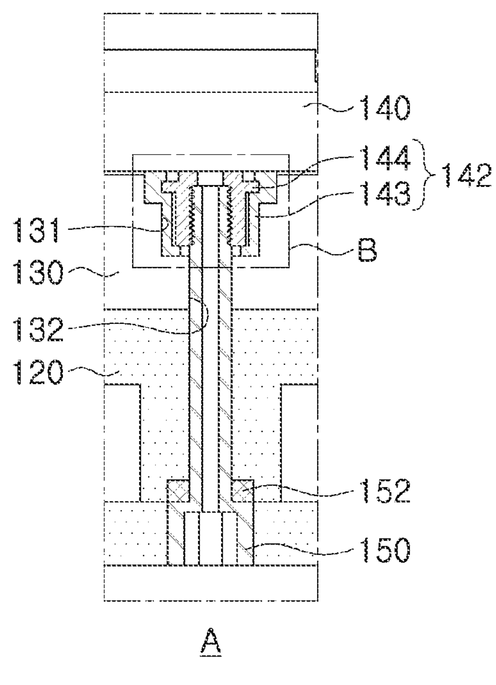
FIG. 2 is an enlarged view of a portion A of FIG. 1.
Figure 3:
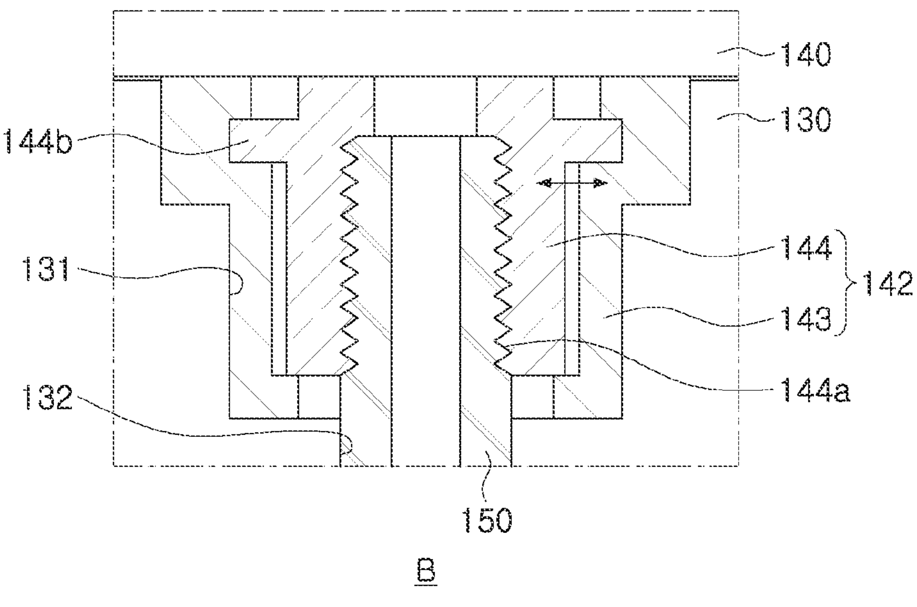
FIG. 3 is an enlarged view of a portion B of FIG. 2.

FIG. 1 is a diagram illustrating the configuration of an electrostatic chuck according to an example embodiment, FIG. 2 is an enlarged view of a portion A of FIG. 1, and FIG. 3 is an enlarged view of a portion B of FIG. 2.

Referring collectively to FIGS. 1 to 3, an electrostatic chuck 100 according to an example embodiment includes a cooling plate 120, an insulating plate 130, an upper plate 140, and a fastening member 150.

The cooling plate 120 includes a cooling flow path 121 through which a cooling fluid flows. The cooling plate 120 may, for example, have a circular plate shape and may be manufactured of a metal material, such as aluminum or cemented carbide, or a composite material of a metal material and ceramic material. Also, the cooling plate 120 may be provided with a coupling hole 122 through which the fastening member 150 passes so that the cooling plate 120 is coupled to the upper plate 140 by the fastening member 150. A plurality of coupling holes 122 may be arranged in regions which do not interfere with the cooling flow path 121.

The insulating plate 130 is disposed on the cooling plate 120. The insulating plate 130 may, for example, be formed of a low thermally conductive material. Meanwhile, the insulating plate 130 is disposed below the upper plate 140 and may be spaced apart from the upper plate 140 by a predetermined distance. Accordingly, the occurrence of cracks in the upper plate 140 due to thermal expansion in a high-temperature environment may be inhibited. Meanwhile, the insulating plate 130 includes an insertion recess 131 into which a fastening portion 142 of the upper plate 140, which will be described later, is inserted and disposed, and the insertion recess 131 may be connected to a communication hole 132 so that the fastening member 150 may be coupled to the fastening portion 142 therethrough. For example, the insulating plate 130 may be bonded and installed on an upper surface of the cooling plate 120.

The upper plate 140 may be fixedly installed to the cooling plate 120 through the fastening member 150. For example, an electrostatic electrode (not shown) and a heating element (not shown) may be embedded and disposed in the upper plate 140. Also, the upper plate 140 may be formed of a material having insulating properties. For example, ceramics, such as alumina, aluminum nitride, and silicon nitride, or organic materials, such as a silicon resin and a polyimide resin may be used as the material of the upper plate 140. For example, the upper plate 140 may be formed of a ceramic material, such as alumina or aluminum nitride.

The upper plate 140 may include a fastening portion 142 to be coupled to the cooling plate 120 through the fastening member 150. For example, the fastening portion 142 may be inserted into the insertion recess 131 of the insulating plate 130 described above. Also, for example, as shown in detail in FIG. 3, the fastening portion 142 may include a body 143 having an internal space and a coupling member 144 inserted into the internal space of the body 143. The body 143 is bonded and installed to be fixed to a lower surface of the upper plate 140 and may be bonded and installed to the lower surface of the upper plate 140 by, for example, diffusion bonding. The body 143 may be formed of a material having elasticity. Accordingly, when the fastening member 150 is fastened to the coupling member 144 and the body 143 is pressed by the coupling member 144, the body

143 may be elastically deformed and may be in close contact with the coupling member 144. For example, an upper end portion of the body 143 may have a diameter greater than a lower end portion thereof so that outer and inner surfaces of the body 143 may be stepped. Also, the coupling member 144 may include a screw thread 144*a* for screw fastening with the fastening member 150 on the inner surface thereof and may include a protrusion 144*b* on an outer surface to be caught on the body 143 formed to be stepped. The protrusion 144*b* is provided at the upper end portion of the coupling member 144 and may be disposed to be adjacent to the upper end portion of the body 143. In this manner, since movement of the coupling member 144 is constrained by the protrusion 144*b*, movement of the fastening member 150 in the first direction, that is, in a vertical direction, may be constrained. Meanwhile, a portion disposed below the protrusion 144*b* of the coupling member 144 may be spaced apart from the inner surface of the body 143 by a predetermined distance. Accordingly, movement of the coupling member 144 in a second direction, that is, a horizontal direction, is not constrained, and the movement in the vertical direction may be constrained by the protrusion 144*b*. Accordingly, stress in the horizontal direction applied to the fastening member 150 during thermal expansion may be alleviated. Therefore, it is possible to prevent cracks occurring during thermal expansion of the upper plate 140.

The first direction described above refers to a direction perpendicular to the upper surface of the upper plate 140, and the second direction refers to a direction parallel to the upper surface of the upper plate 140 and perpendicular to the first direction.

The fastening member 150 serves to couple the cooling plate 120 and the upper plate 140 to each other. For example, the fastening member 150 may be formed of a bolt. Meanwhile, a washer 152 may be installed between a head portion of the fastening member 150 and the cooling plate 120. For example, the coupling hole 122 of the cooling plate 120 may be formed to be stepped and the washer 152 may be installed between the head portion of the fastening member 150 and the stepped portion of the coupling hole 122. Also, the fastening member 150 is screwed to the coupling member 144 to couple the cooling plate 120 to the upper plate 140. Accordingly, movement of the fastening member 150 in the horizontal direction is not constrained, and movement of the fastening member 150 in the vertical direction may be constrained. Accordingly, cracks in the upper plate 140 may be prevented by alleviating stress in the horizontal direction when thermal expansion occurs.

As described above, since the cooling plate 120 and the upper plate 140 are coupled through the fastening member 150, damage to the upper plate 140 due to thermal expansion may be prevented.

Figure 4:
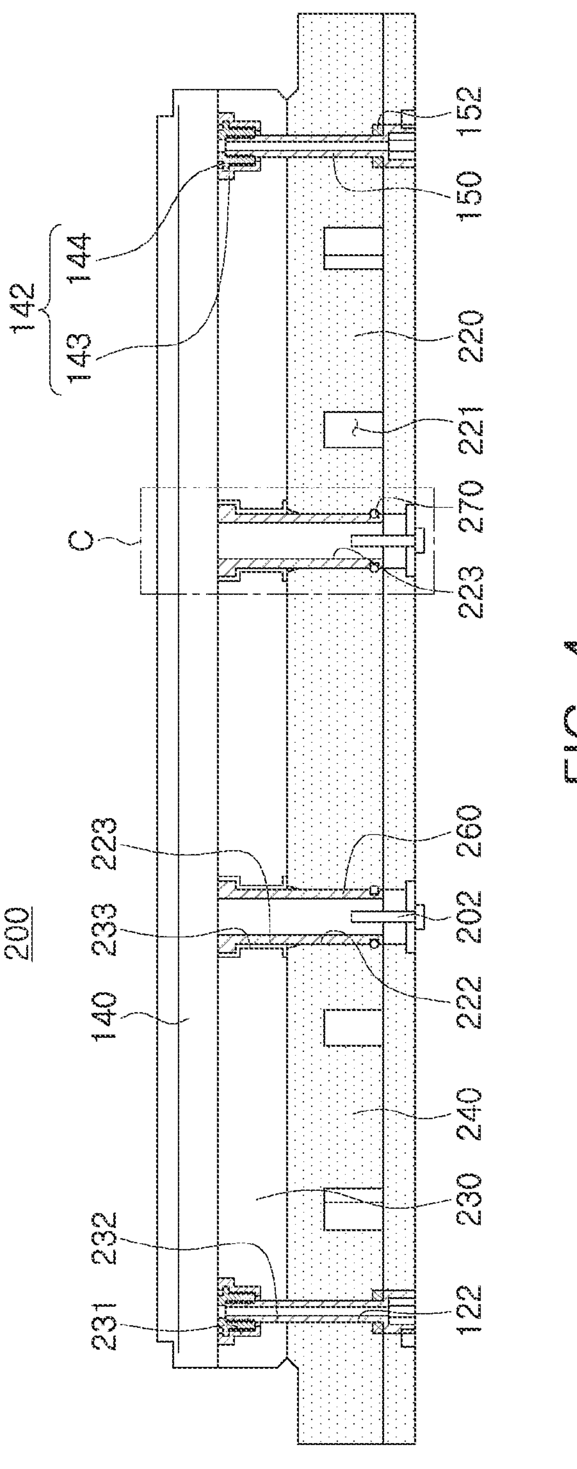
FIG. 4 is a diagram illustrating the configuration of an electrostatic chuck according to another example embodiment.
Figure 5:
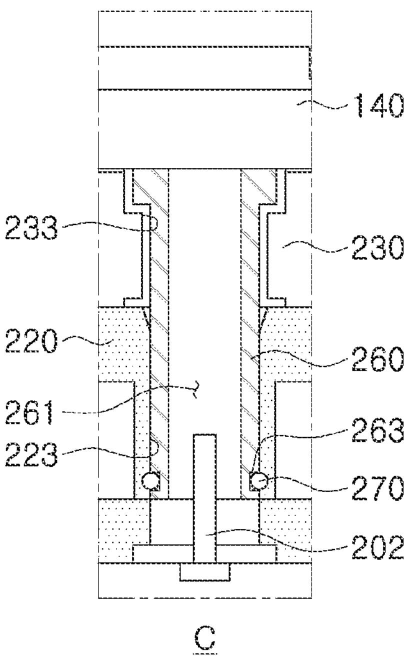
FIG. 5 is an enlarged view illustrating a portion C of FIG. 4.

FIG. 4 is a configuration diagram illustrating an electrostatic chuck according to an example embodiment, and FIG. 5 is an enlarged view illustrating portion C of FIG. 4.

Referring to FIGS. 4 and 5, an electrostatic chuck 200 according to an example embodiment includes a cooling plate 220, an insulating plate 230, an upper plate 140, a fastening member 150, and a terminal bushing 260.

Meanwhile, the upper plate 140 and the fastening member 150 may include components substantially the same as those described above and, thus, a detailed description thereof will be omitted and replaced with the above description.

The cooling plate 220 includes a cooling flow path 221 through which a cooling fluid flows. For example, the cooling plate 220 may have a circular plate shape. Meanwhile, the cooling plate 220 may be manufactured using a metal material, such as aluminum or cemented carbide, or a composite material of the metal material and a ceramic material. In addition, the cooling plate 220 may include a coupling hole 222 through which the fastening member 150 passes so that the cooling plate 220 is coupled to the upper plate 140 through the fastening member 150. A plurality of coupling holes 222 may be arranged in a region not interfered with by the cooling flow path 221. The cooling plate 220 includes an installation hole 223 in which the terminal bushing 260 is installed, and the installation hole 223 may be formed to be stepped to prevent the terminal bushing 260 from being separated.

The insulating plate 230 is disposed on the cooling plate 220. For example, the insulating plate 230 may be formed of a low thermally conductive material. The insulating plate 230 may be disposed below the upper plate 140 and may be spaced apart from the upper plate 140 by a predetermined distance. Accordingly, the occurrence of cracks in the upper plate 140 due to thermal expansion in a high-temperature environment may be prevented. The insulating plate 230 may include an insertion recess 231 into which the fastening portion 142 of the upper plate 140 is inserted and disposed, and the insertion recess 231 may be connected to a communication hole 232 so that the fastening member 150 may pass therethrough to be coupled to the fastening portion 142. The insulating plate 230 may include a connection hole 233 connected to the installation hole 223 of the cooling plate 220 and through which the terminal bushing 260 passes. For example, a lower end portion of the terminal bushing 260 may pass through the connection hole 233 and be inserted into the installation hole 223.

The terminal bushing 260 may be installed on the insulating plate 230 and the cooling plate 220 to be connected to the upper plate 140. For example, the terminal bushing 260 may be bonded to a lower surface of the upper plate 140. For example, the terminal bushing 260 may be formed of a ceramic material and may be bonded to the upper plate 140 by diffusion bonding. The terminal bushing 260 includes a terminal hole 261 in which a terminal 202 is installed. Also, a sealing groove 263 into which a sealing member 270 for sealing is inserted may be provided at a lower end portion of an outer surface of the terminal bushing 260. For example, the sealing member 270 may be formed of an O-ring or formed of a ceramic material.

As such, since the terminal bushing 260 is formed of ceramic material, it is possible to reduce thermal conduction to a lower portion of the terminal bushing 260 by adjusting thermal conductivity and a thermal expansion rate, and the terminal hole 261 may be sealed by the sealing member 270 formed of a ceramic material. Furthermore, thermal stress may be reduced by the terminal bushing 260 and the sealing member 270 formed of a ceramic material.

According to an example embodiment of the present disclosure, an electrostatic chuck that may be used without damage in a high temperature environment may be provided.

While example embodiments have been shown and described above, it will be apparent to those skilled in the art that modifications and variations could be made without departing from the scope of the present disclosure as defined by the appended claims.

What is claimed is:

1. An electrostatic chuck comprising:

a cooling plate having a cooling flow path;

an insulating plate disposed on the cooling plate and defining (i) a fastener insertion recess at an upper surface of the insulating plate and (ii) a communication hole extending from the fastener insertion recess and through the insulating plate in a direction intersecting the upper surface of the insulating plate;

an upper plate disposed above the insulating plate and having a lower surface facing the upper surface of the insulating plate, the upper plate including a fastening portion that extends from the lower surface into the insulating plate and is received at the fastener insertion recess of the insulating plate; and a fastener coupling the cooling plate to the upper plate with the insulating plate between the cooling plate and the upper plate, wherein the fastener passes through the cooling plate and the communication hole of the insulating plate, and has a first end coupled to the fastening portion of the upper plate.

2. The electrostatic chuck of claim 1, wherein the fastening portion includes:

a body having an internal space and fixedly installed on the lower surface of the upper plate and, a coupling member inserted into the internal space of the body and coupled to the fastener.

3. The electrostatic chuck of claim 2, wherein the coupling member includes a protrusion to be caught on an inner surface of the body formed to be stepped.

4. The electrostatic chuck of claim 3, wherein a portion disposed below the protrusion of the coupling member is spaced apart from the inner surface of the body by a predetermined distance.

5. The electrostatic chuck of claim 1, wherein the cooling plate includes a coupling hole disposed below the communication hole and allowing the fastener to be coupled thereto.

6. The electrostatic chuck of claim 5, wherein the coupling hole is formed to have a stepped region and a washer is installed between the fastener and the stepped region of the coupling hole.

7. The electrostatic chuck of claim 1, wherein the upper plate and the insulating plate are spaced apart from each other.

8. The electrostatic chuck of claim 1, wherein the insulating plate is bonded to an upper surface of the cooling plate.

9. The electrostatic chuck of claim 1, wherein the upper plate is formed of a ceramic material.

10. The electrostatic chuck of claim 1, further comprising:

a terminal bushing disposed to pass through the insulating plate and the cooling plate, and a sealer installed on an outer surface of the terminal bushing.

11. The electrostatic chuck of claim 10, wherein the terminal bushing and the sealer are formed of a ceramic material.

12. The electrostatic chuck of claim 10, wherein the terminal bushing is inserted into:

an installation hole provided in the cooling plate, and a connection hole provided in the insulating plate connected to the installation hole.

13. The electrostatic chuck of claim 12, wherein the sealer is disposed at a lower end portion of the installation hole to seal the installation hole.

14. An electrostatic chuck comprising:

a cooling plate having a cooling flow path;

an insulating plate disposed on the cooling plate and defining (i) a fastener insertion recess at an upper surface of the insulating plate and (ii) a communication hole extending from the fastener insertion recess and through the insulating plate in a direction intersecting the upper surface of the insulating plate;

an upper plate disposed above the insulating plate and having a lower surface facing the upper surface of the insulating plate, the upper plate including a fastening portion that extends from the lower surface into the insulating plate and is received at the fastener insertion recess of the insulating plate; and a fastener coupling the cooling plate to the upper plate with the insulating plate between the cooling plate and the upper plate, wherein the insulating plate and the upper plate are spaced apart from each other, wherein the upper plate is formed of a ceramic material, and wherein the fastener passes through the cooling plate and the communication hole of the insulating plate, and has a first end coupled to the fastening portion of the upper plate.

15. The electrostatic chuck of claim 14, wherein:

the fastening portion includes:

a body having an internal space and fixedly installed on the lower surface of the upper plate; and a coupling member inserted into the internal space of the body and coupled to the fastener, and the coupling member includes a protrusion to be caught on an inner surface of the body formed to be stepped.

16. The electrostatic chuck of claim 14, further comprising:

a terminal bushing disposed to pass through the insulating plate and the cooling plate, and a sealer installed on an outer surface of the terminal bushing.

17. An electrostatic chuck comprising:

a cooling plate having a cooling flow path;

an insulating plate disposed on the cooling plate and defining (i) a fastener insertion recess at an upper surface of the insulating plate and (ii) a communication hole extending from the fastener insertion recess and through the insulating plate in a direction intersecting the upper surface of the insulating plate;

an upper plate disposed above the insulating plate and having a lower surface facing the upper surface of the insulating plate, the upper plate including a fastening portion that extends from the lower surface into the insulating plate and is received at the fastener insertion recess of the insulating plate, the fastening portion including: (1) a body having an internal space and fixedly installed on the lower surface of the upper plate and (2) a coupling member inserted into the internal space of the body; and a fastener coupling the cooling plate to the coupling member of the upper plate with the insulating plate between the cooling plate and the upper plate, wherein the fastener passes through the cooling plate and the communication hole of the insulating plate, and has a first end coupled to the coupling member of the fastening portion, wherein the coupling member includes a protrusion to be caught on an inner surface of the body formed to be stepped, and wherein a portion disposed below the protrusion of the coupling member is spaced apart from the inner surface of the body by a predetermined distance.

18. The electrostatic chuck of claim 17, further comprising:

a terminal bushing disposed to pass through the insulating plate and the cooling plate; and a sealer installed on an outer surface of the terminal bushing, wherein the coupling member includes screw threads through which the fastener is screwed into the coupling member.

* * * * *